(12) United States Patent
Wuister et al.

(10) Patent No.: US 8,967,991 B2
(45) Date of Patent: Mar. 3, 2015

(54) IMPRINT LITHOGRAPHY TEMPLATE

(75) Inventors: Sander Frederik Wuister, Eindhoven (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 851 days.

(21) Appl. No.: 12/843,657

(22) Filed: Jul. 26, 2010

(65) Prior Publication Data

US 2011/0018168 A1    Jan. 27, 2011

Related U.S. Application Data

(60) Provisional application No. 61/228,772, filed on Jul. 27, 2009.

(51) Int. Cl.
| | |
|---|---|
| *B29C 59/00* | (2006.01) |
| *G03F 7/00* | (2006.01) |
| *B82Y 10/00* | (2011.01) |
| *B82Y 40/00* | (2011.01) |
| *G03F 9/00* | (2006.01) |

(52) U.S. Cl.
CPC .............. *G03F 7/0002* (2013.01); *B82Y 10/00* (2013.01); *B82Y 40/00* (2013.01); *G03F 9/00* (2013.01)
USPC ........................................ 425/385; 425/150

(58) Field of Classification Search
CPC ....................................................... B29C 59/00
USPC .................... 425/385, 150; 264/293
See application file for complete search history.

(56) References Cited

U.S. PATENT DOCUMENTS

| | | | |
|---|---|---|---|
| 4,731,155 A | 3/1988 | Napoli et al. ................ 156/643 |
| 5,772,905 A | 6/1998 | Chou ............................ 216/44 |
| 6,334,960 B1 | 1/2002 | Willson et al. ................ 216/52 |
| 7,309,225 B2 * | 12/2007 | McMackin et al. .......... 425/215 |
| 2002/0102811 A1 * | 8/2002 | Farrow et al. ................ 438/401 |
| 2004/0021866 A1 | 2/2004 | Watts et al. .................. 356/401 |
| 2004/0124566 A1 | 7/2004 | Sreenivasan et al. ........ 264/494 |
| 2005/0064344 A1 | 3/2005 | Bailey et al. ................ 430/320 |
| 2005/0274693 A1 | 12/2005 | Heidari et al. ................ 216/52 |
| 2006/0266244 A1 * | 11/2006 | Kruijt-Stegeman et al. .. 101/485 |
| 2006/0279004 A1 * | 12/2006 | Suehira et al. ............... 257/797 |

(Continued)

FOREIGN PATENT DOCUMENTS

| | | |
|---|---|---|
| JP | 05-182885 A | 7/1993 |
| JP | 2004-505439 | 2/2004 |

(Continued)

OTHER PUBLICATIONS

Haisma, et al., "Mold-assisted nanolithography: A process for reliable pattern replication", J. Vac. Sci. Technol. B 14(6), Nov./Dec. 1996, pp. 4124-4128.

(Continued)

*Primary Examiner* — Maria Veronica Ewald
(74) *Attorney, Agent, or Firm* — Pillsbury Winthrop Shaw Pittman LLP

(57) ABSTRACT

An imprint lithography template is disclosed. In an embodiment, the template includes a patterned region to imprint a layer of imprintable medium, and an alignment mark for use in aligning the imprint template, the alignment mark configured such that imprintable medium is prevented from filling the alignment mark when the imprint template imprints the imprintable medium.

21 Claims, 8 Drawing Sheets

(56) References Cited

U.S. PATENT DOCUMENTS

| | | |
|---|---|---|
| 2007/0262936 A1 * | 11/2007 | Chang et al. ............ 345/87 |
| 2008/0211133 A1 | 9/2008 | Terasaki et al. ............ 264/219 |
| 2009/0214689 A1 | 8/2009 | Bailey et al. ............ 425/150 |

FOREIGN PATENT DOCUMENTS

| | | |
|---|---|---|
| JP | 2005-349619 | 12/2005 |
| JP | 2007-103915 | 4/2007 |
| JP | 2007-140460 | 6/2007 |
| JP | 2007-190734 | 8/2007 |
| JP | 2007-304596 | 11/2007 |
| JP | 2008-509825 | 4/2008 |
| JP | 2008-221822 | 9/2008 |
| JP | 2009-119695 | 6/2009 |
| JP | 2009-143089 | 7/2009 |
| WO | WO 02/067055 | 8/2002 |

OTHER PUBLICATIONS

Japanese Office Action mailed Feb. 28, 2012 in corresponding Japanese Patent Application No. 2010-162396.

Japanese Appeal Decision mailed Jul. 29, 2013 in corresponding Japanese Patent Application No. 2010-162396.

* cited by examiner

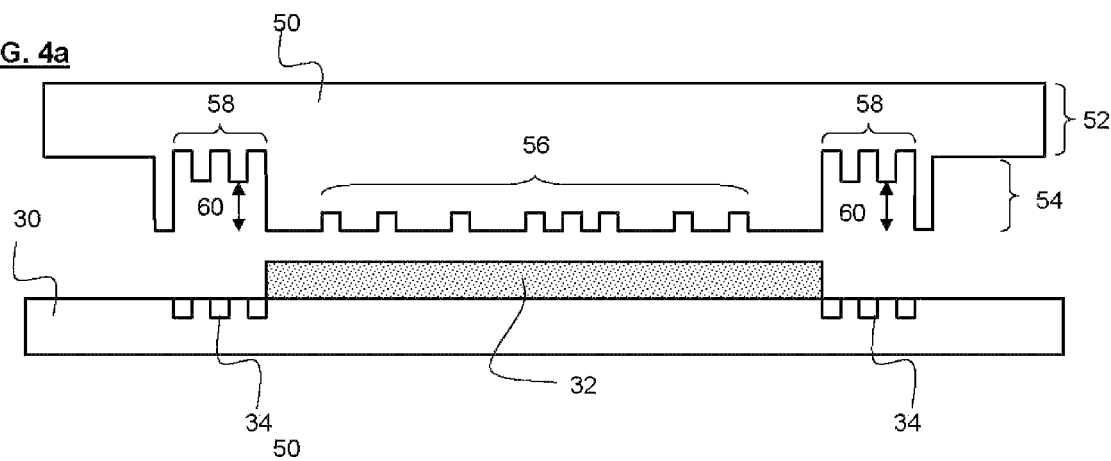
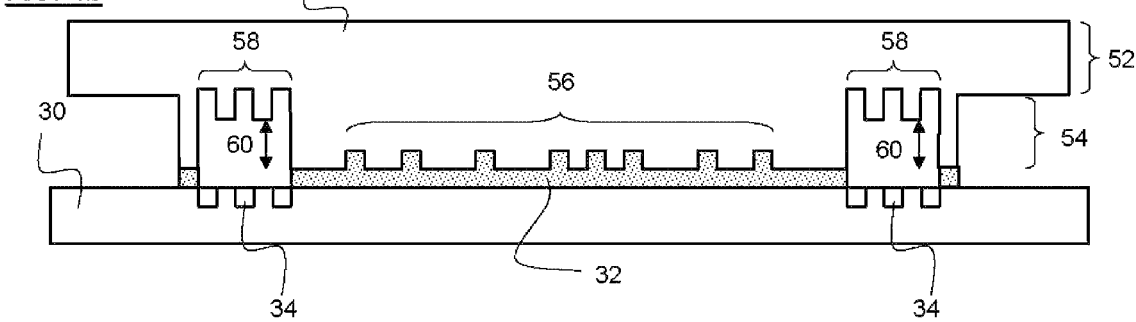
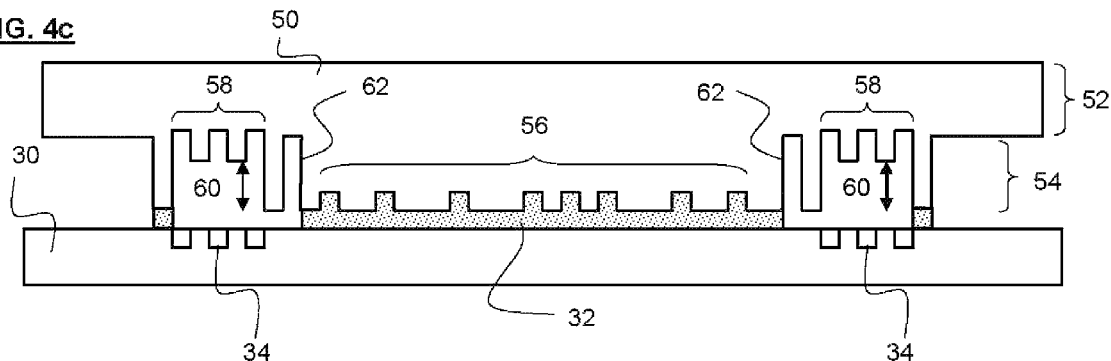
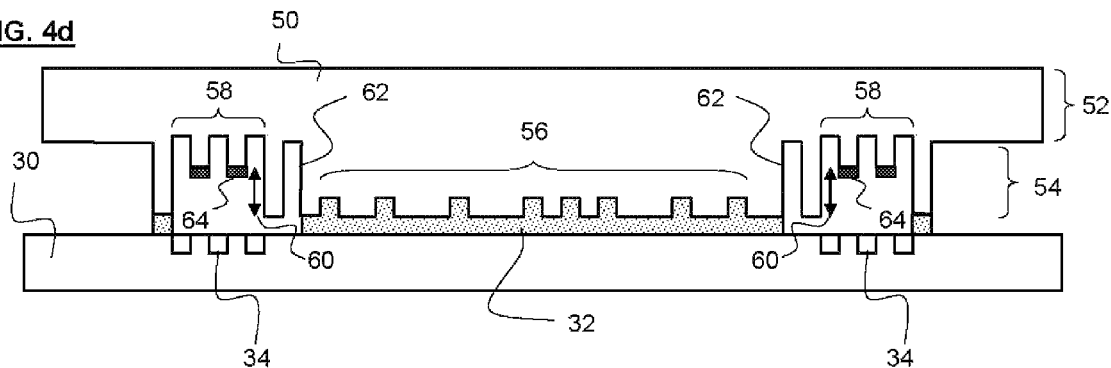

IMPRINT LITHOGRAPHY TEMPLATE

This application claims priority and benefit under 35 U.S.C. §119(e) to U.S. Provisional Patent Application No. 61/228,772, entitled "Imprint Lithography Template", filed on Jul. 27, 2009. The content of that application is incorporated herein in its entirety by reference.

FIELD

The present invention relates to an imprint lithography template.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve contacting a patterned surface of an imprint template with a layer of imprintable medium such that the imprintable medium flows around protrusions and into recesses in the patterned surface and is pushed aside by protrusions on the patterned surface. The recesses and protrusions define pattern features of the patterned surface of the imprint template. Typically, the imprintable medium is flowable as the patterned surface contacts the imprintable medium. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium droplets on the surface of a substrate to be patterned.

In order to be able to accurately apply patterns to imprintable medium provided on a substrate, it is desirable to be able to accurately align the imprint template used to imprint that pattern with a specific area or part of the substrate. Partial or coarse alignment may take place before the pattern of the imprint template is imprinted into the imprintable medium. Final and fine alignment may take place when the pattern of the imprint template is imprinted into the imprintable medium, and before, for example, the pattern in the imprintable medium is fixed or frozen by exposure to UV radiation. Alignment commonly involves directing radiation onto or through two spaced apart gratings, one on or in the imprint template and one on or in the substrate. Diffraction of the radiation and/or the movement of fringes may be used in the alignment process.

SUMMARY

There may, however, be one or more problems associated with the way in which alignment is currently undertaken. When the pattern of the imprint template is imprinted into the imprintable medium, the grating or gratings (or, in more generic terms, the alignment marks) in the imprint template may become filled with imprintable medium. The refractive index of imprintable medium may correspond substantially with a refractive index of the imprint template (for example if the imprintable medium is acrylate resist and if the imprint template is formed from fused silica). Because the refractive index of the imprintable medium and the imprint template substantially match one another, the result is a severe contrast loss and an unfavorable signal-to-noise ratio of radiation returning to an alignment sensor. This makes it difficult to perform accurate align between the imprint template and the substrate.

Various approaches have been proposed for overcoming one or more of the problems referred to above. In one example, a recess is provided which surrounds a patterned region to be imprinted into the imprintable medium, the recess preventing the imprintable medium from reaching the alignment marks. The recess may be described as, for example, a moat or trench which surrounds the patterned region to be imprinted into the imprintable medium. A disadvantage associated with the use of such a recess is that the area over which the recess extends, cannot be used for applying patterns to the imprintable medium. This results in a reduction in the total area of the substrate on which the imprintable medium is located that is available for patterning.

There is at least one other problem associated with that proposed alignment structure and method. An imprint template comprises a base region from which extends a mesa region. The base region and the mesa region are usually formed from a single body of material. The mesa region is provided with a patterned region, the patterned region being the region that is to be used to apply a pattern to imprintable medium provided on a substrate. In the proposed alignment structure and method, the alignment marks provided on the imprint template extend from the base region to the same extent as the patterned region. This means that when imprinting the patterned region into the imprintable medium, the alignment marks may also be imprinted into the imprintable medium, or imprintable medium may be allowed to more readily flow into recesses provided by the alignment marks. Furthermore, it is proposed to provide one or more parts of the alignment marks with material that is opaque to radiation used in the alignment process. The opaque material improves, for example, the contrast or signal-to-noise ratio of radiation used to determine the alignment. However, the provision of this opaque material may increase the problem mentioned earlier in this paragraph. For instance, if the alignment marks already extend from the base region to the same extent as the patterned region, and then the alignment marks are provided with a further layer of opaque material, the alignment marks and opaque material will in combination extend further from the base region of the imprint template than the patterned region. The alignment marks and opaque material may therefore, for example, come into contact with the substrate itself. Such contact may result in damage to the substrate, alignment marks, or the opaque layer of material provided on those alignment marks.

Accordingly, it is desirable, for example, to provide an imprint lithography template that obviates or mitigates at least one problem of the prior art, whether identified herein or elsewhere, or which provides an alternative to an existing imprint lithography template.

According to an aspect, there is provided an imprint lithography template comprising: a patterned region to imprint a layer of imprintable medium; and an alignment mark for use in aligning the imprint template, the alignment mark configured such that imprintable medium is prevented from filling the alignment mark when the imprint template imprints the imprintable medium.

The configuration of the alignment mark may be at least one selected from: an aspect ratio; a depth; a width; or a profile (e.g. a wall angle or the like), which results in imprintable medium being prevented from filling the alignment mark when the imprint template imprints the imprintable medium.

The alignment mark may have a depth of: at least 100 nm; or between 100 nm and 10,000 nm.

According to an aspect, there is provided an imprint lithography template comprising: a base region; a mesa region that extends from the base region, the mesa region having a patterned region to imprint a layer of imprintable medium; and an alignment mark for use in aligning the imprint template, wherein the patterned region is located further from the base region than the alignment mark.

The alignment mark may be in a recess provided in the mesa region.

The alignment mark may be on a protrusion which extends from the base region and which is adjacent the mesa region. The protrusion may be in contact with or separate from the mesa region.

The mesa region may further comprise a further alignment mark configured to be filled with imprintable medium when the imprint template is imprinted into the imprintable medium.

According to an aspect, there is provided an imprint lithography template comprising: a patterned region to imprint a layer of imprintable medium; an alignment mark for use in aligning the imprint template, the alignment mark embedded within material forming the imprint template; and a surface of the imprint template adjacent (e.g. below, when the imprint template is oriented for imprinting) the embedded alignment mark having a further patterned region, the further patterned region being free of an alignment mark.

The further patterned region may comprise one or more structures configured, in use, to form test structures in the imprintable medium.

According to any aspect, the imprint lithography template may further comprise a recess which is located between the alignment mark and/or the further alignment mark and the patterned region and/or the further patterned region, the recess configured such that imprintable medium is prevented from filling the recess when the imprint template imprints the imprintable medium. The recess may form a moat around the patterned region and/or the further patterned region. The configuration of the recess may be at least one selected from: an aspect ratio; a depth; a width; or a profile (e.g. a wall angle or the like), which results in imprintable medium being prevented from filling the recess when the imprint template imprints the imprintable medium. In an embodiment, the alignment mark may be located in such a recess.

According to any aspect, the patterned region and/or further patterned region may comprise one or more features (e.g. pattern features, structures, recesses or the like) having one or more dimensions of the order of nanometers. The patterned region and/or further patterned region may comprise one or more features having a depth of 10-100 nm.

According to any aspect, the alignment mark and/or the further alignment mark may comprise one or more features (e.g. pattern features, structures, recesses or the like) having one or more dimensions of the order of micrometers.

According to any aspect, the alignment mark and/or the further alignment mark may be provided with an amount (e.g. a layer or coating) of material that is substantially opaque to radiation that is to be used to align the imprint template.

According to an aspect, there is provided an imprint lithography apparatus comprising: an imprint lithography template according to any one or more embodiments of the invention, configured to imprint a pattern in an imprintable medium on a substrate; an imprint template configured to hold the imprint lithography template; and a substrate holder configured to hold the substrate.

According to an aspect, there is provided an imprint lithography method, the method comprising: undertaking a first imprint in imprintable medium on a first area of a substrate, and providing alignment marks in imprintable medium on the first area of the substrate with the first imprint; and undertaking a second imprint in imprintable medium on a second area of a substrate that is adjacent to the first area of the substrate, the second imprint aligned using the alignment marks provided in the first imprint. The undertaking of the second imprint may comprise providing alignment marks in imprintable medium on the second area of the substrate. The first area and second area may be first and second dies of the substrate. The first or second imprint may be undertaken using an imprint lithography template according to an embodiment of the invention.

BRIEF DESCRIPTION OF THE DRAWINGS

Specific embodiments of the invention will be described with reference to the accompanying Figures, in which:

FIGS. 4a and 4b schematically depict an imprint template according to an embodiment of the invention, and use of that imprint template in imprinting a pattern into a layer of imprintable medium;

FIG. 4c schematically depicts a modification to the imprint template shown in and described with reference to FIGS. 4a and 4b;

FIG. 4d schematically depicts a modification to the imprint template shown in and described with reference to FIG. 4c;

DETAILED DESCRIPTION

Figure 1A:
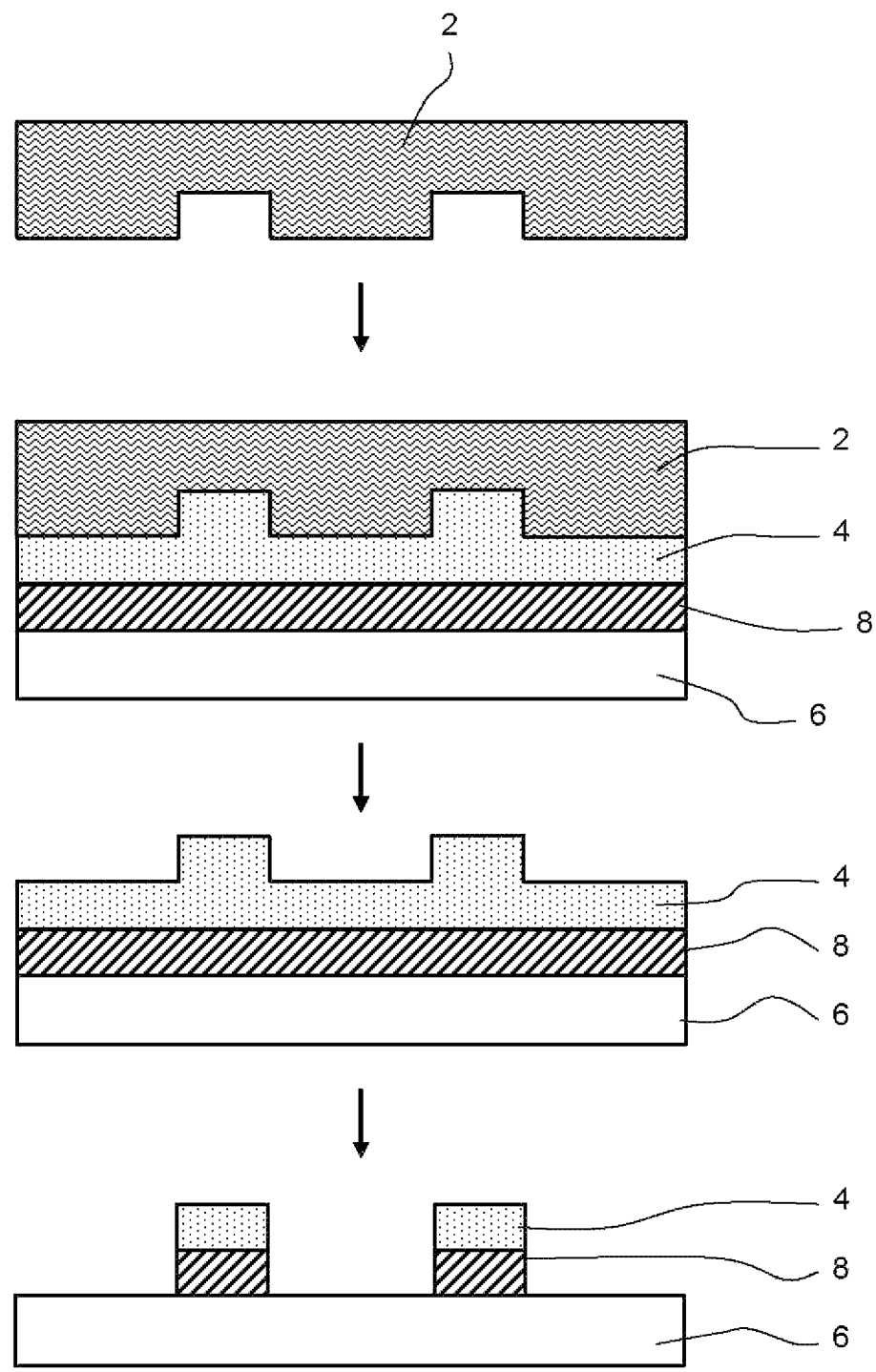
FIGS. 1a and 1b schematically depict examples of, respectively, hot imprint, and UV imprint lithography.
Figure 1B:
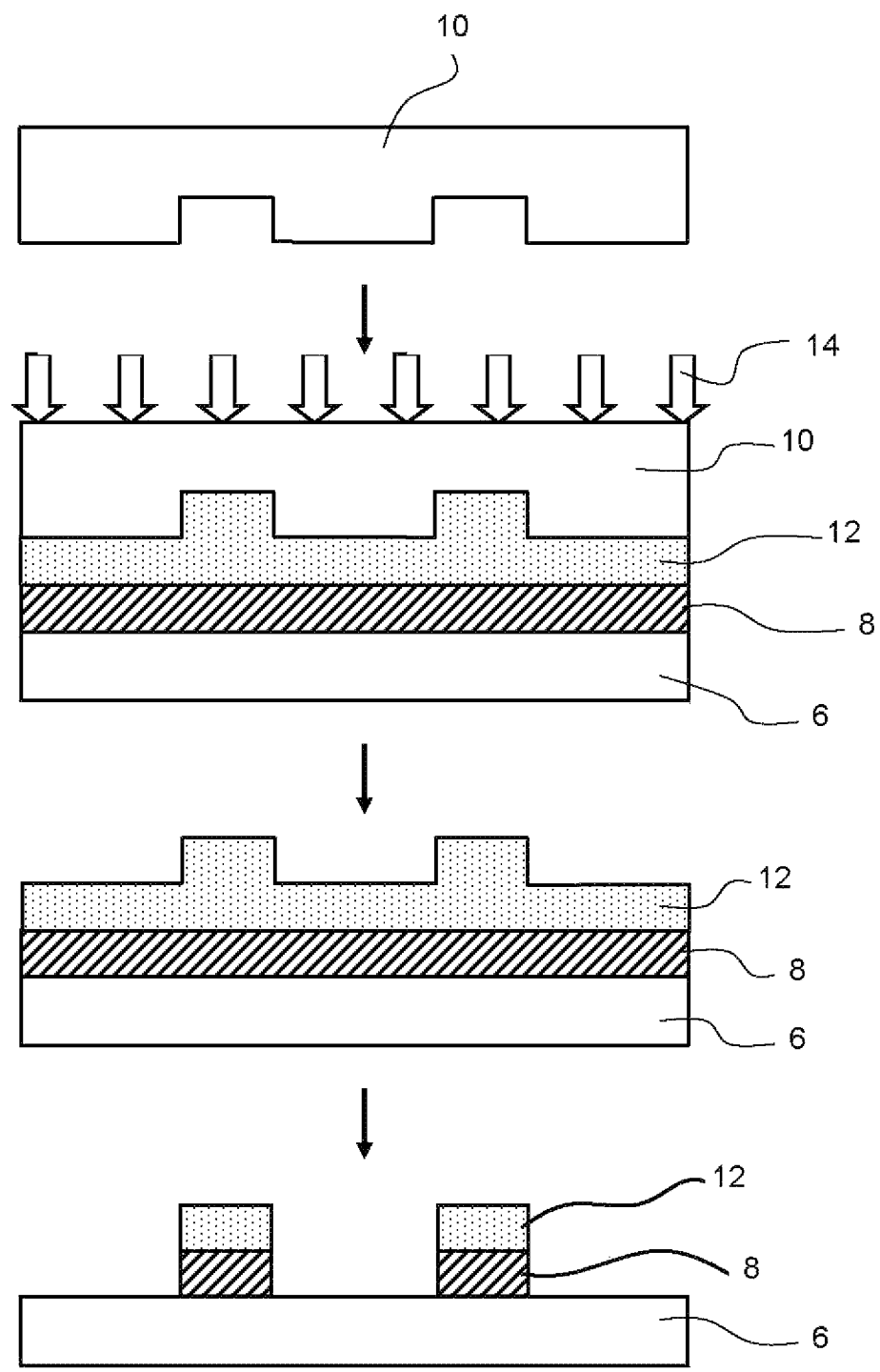

Examples of two approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may be, for instance, spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template contacts the flowable resin and then is cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1a. However, instead of using heat or temperature cycling as in hot imprint, the pattern is frozen by curing the imprintable medium with UV radiation 14 that is applied through the quartz template onto the imprintable medium. After removal of the template, the pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

Figure 2A:
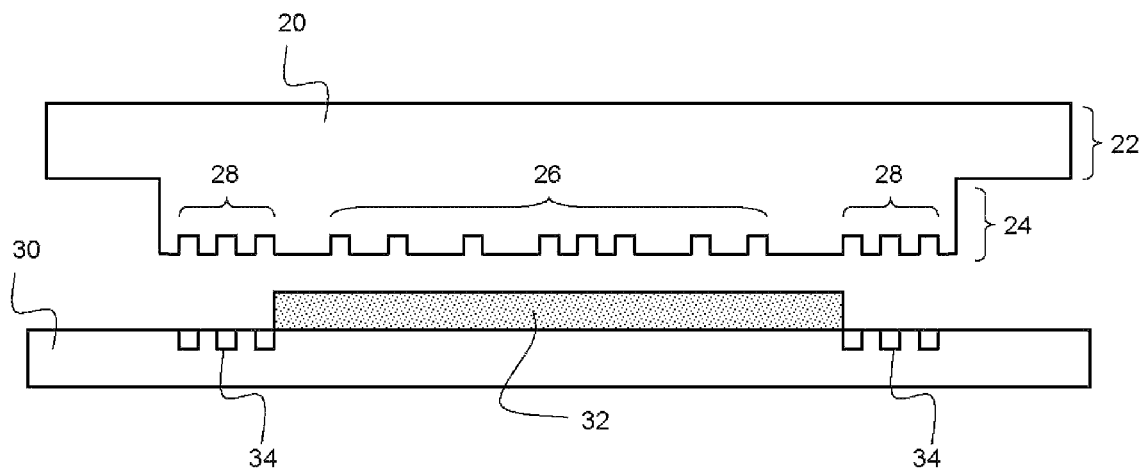
FIGS. 2a to 2c schematically depict embodiments of proposed imprint templates and the use of those templates in imprinting a pattern into a layer of imprintable medium.
Figure 2B:
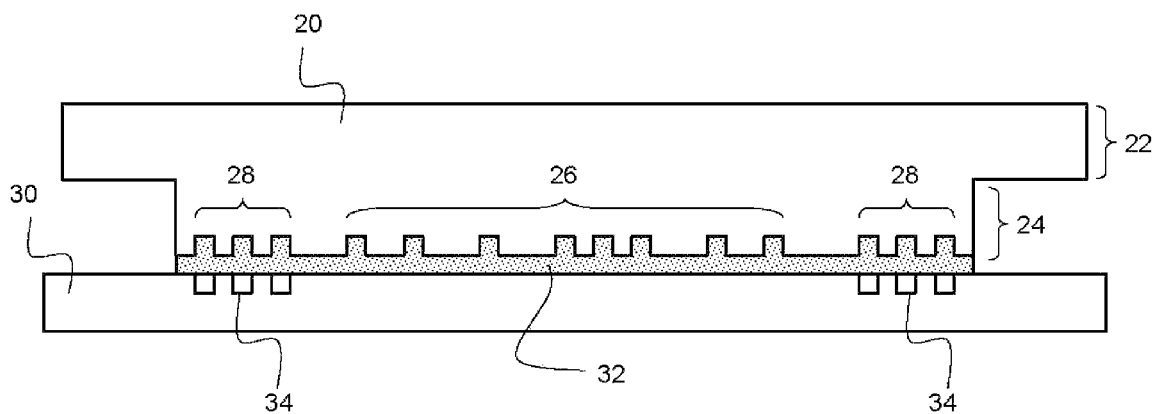
Figure 2C:
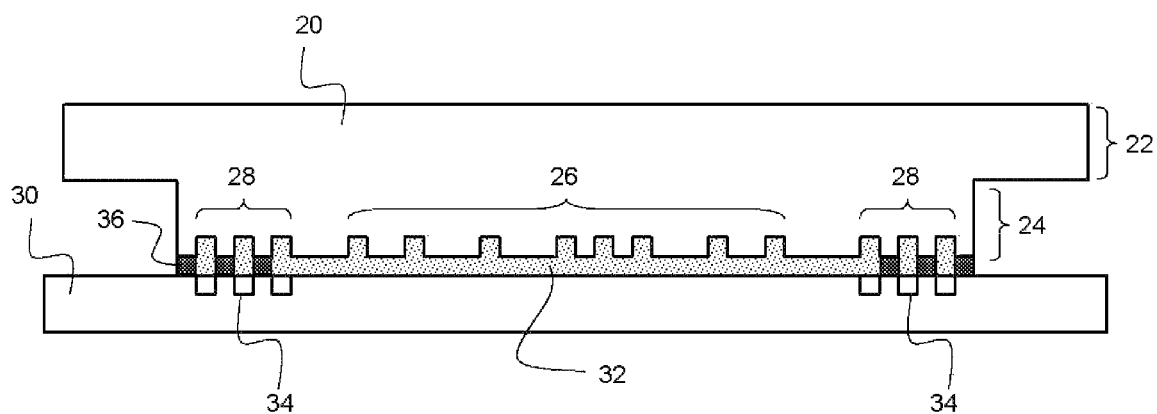

As discussed previously, it is desirable to be able to accurately align an imprint template with a part or area of a substrate in order to ensure that patterns are accurately imprinted into imprintable medium provided on that substrate. Also as discussed above, there may be one or more problems associated with certain proposed alignment mark structures used in the alignment of the imprint template with the one or more parts of the substrate. FIGS. 2a, 2b and 2c will be used to describe some of those problems.

FIG. 2a schematically depicts an imprint template 20. The imprint template 20 comprises a base region 22 and a mesa region 24 that extends from the base region 22. The mesa region 24 may be formed separately from and attached to the base region 22. However, in practice it is envisaged that the base region 22 and mesa 24 will be formed integrally, for example from a single piece of material such as quartz or fused silica or the like.

The mesa region 24 is provided with a patterned region 26 for imprinting a layer of imprintable medium. The patterned region 26 is provided with projections and recesses necessary to imprint the imprintable medium with pattern features which may be used, for example, to form parts of circuit features or electronic devices or the like. The mesa region 24 further comprises alignment marks 28 disposed either side of the patterned region 26 (and, for example, around the patterned region 26). The patterned region 26 is located at approximately the same distance from the base region as the alignment marks 28 (i.e. the patterned region 26 and alignment marks 28 are located in substantially the same plane relative to the base region 22 of the imprint template 20). In another embodiment (not shown) there may also be alignment marks inside the patterned region, for example if the patterned region is larger than one die on or of the substrate.

It is to be understood that the imprint template 20 is not drawn to scale. In practice, the alignment marks 28 are likely to comprise one or more features having one or more dimensions of the order of micrometers. Conversely, the patterned region 26 is likely to comprise one or more features having one or more dimensions of the order of nanometers.

In addition to the imprint template 20, a substrate 30 is shown. Provided on the substrate 30 is a layer of imprintable medium 32. The layer of imprintable medium may be continuous in nature (as shown in the Figure) or may comprise a plurality of droplets or the like. The substrate 30 is also provided with alignment marks 34 for use in combination with the alignment marks 28 of the imprint template 20 to obtain alignment between the imprint template 20 and the substrate 30.

FIG. 2b shows the imprint template 20 when the patterned region 26 has been imprinted into an imprintable medium 32 provided on the substrate 30. The imprintable medium 32 flows around and fills recesses provided in the patterned region 26. However, the imprintable medium 32 also flows around and into recesses provided by the alignment marks 28. The imprintable medium 32 may have a refractive index which substantially matches that of the imprint template 20. This may result in a severe loss of contrast and a poor signal-to-noise ratio of radiation returning to an alignment sensor after passing through the alignment marks 28 of the imprint template 20 and/or the alignment marks 34 of the substrate 30. It may be desirable, for example, to obviate or mitigate this problem.

If one or more parts of the alignment marks 28 provided in the imprint template 20 are provided with an amount (e.g. a layer or coating) of opaque material to reduce the loss in contrast or improve the signal-to-noise ratio, the opaque material may come in contact with the substrate 30 during the imprinting process. This may result in wear of the opaque material or damage to the alignment marks 28, imprint template 20 or the substrate 30.

FIG. 2c schematically depicts the imprint template 20 of FIGS. 2a and 2b, but with parts (i.e. the protrusions) of the alignment marks 28 being provided with an opaque layer of material 36. The opaque layer of material 36 comes into contact with the substrate 30 during imprinting. It is desirable to avoid any such contact wherever possible, and it may thus be desirable, for example, to obviate or mitigate this problem.

One or more of the problems described in relation to the imprint templates shown in FIGS. 2a to 2c may be overcome by one or more of the embodiments of the invention, as described in relation to FIGS. 3 to 6. The embodiments shown in FIGS. 3 to 6 are given by way of example only. As with FIG. 2, FIGS. 3 to 6 are not drawn to scale. For instance, although not specifically depicted in the Figures, the alignment marks and/or further alignment marks may comprise one or more features having one or more dimensions of the order of micrometers. The patterned region and/or further patterned region may comprise one or more features having one or more dimensions of the order of nanometers. Reference is now made to FIGS. 3 to 6.

Figure 3A:
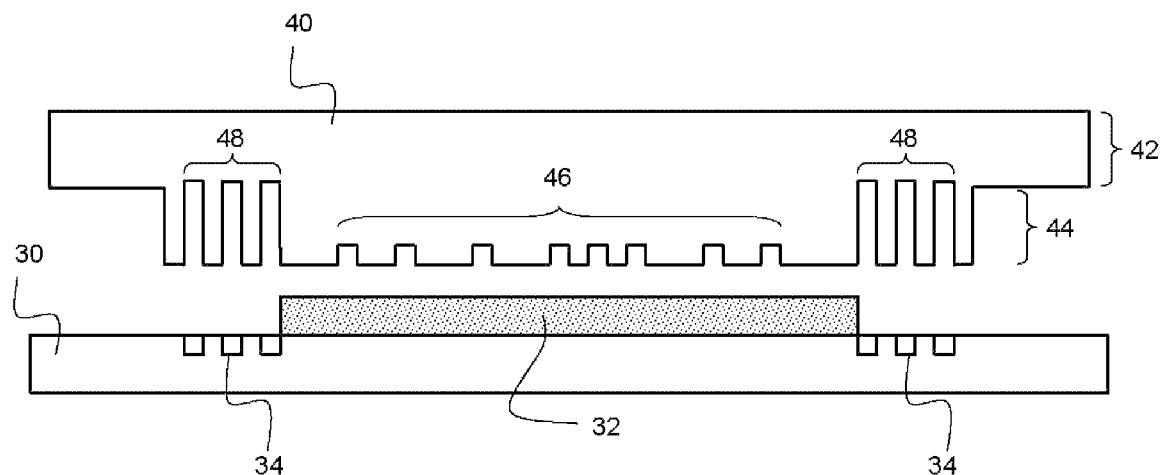
FIGS. 3a and 3b schematically depict an imprint template according to an embodiment of the invention, and use of that imprint template in imprinting a pattern into a layer of imprintable medium.

FIG. 3a schematically depicts an imprint template 40 according to an embodiment of the invention. The imprint template 40 comprises of a base region 42 and a mesa region 44 which extends from the base region 42. The mesa region 44 and base region 42 may be formed integrally, and may be formed from a single piece of material such as fused silica, or quartz or the like. The mesa region 44 is provided with a patterned region 46 for imprinting a pattern into imprintable medium. Located either side of the patterned region 46 are alignment marks 48.

The alignment marks 48 are configured such that imprintable medium is prevented from filling the alignment marks 48 when the imprint template 40 is imprinted into imprintable medium. This may be achieved by ensuring that the configuration of the alignment mark is at least one selected from: an aspect ratio, a depth, a width, or a profile (e.g. a wall angle or the like) which results in imprintable medium being prevented from filling the alignment marks 48 when the imprint template 40 is imprinted into imprintable medium. For instance, the alignment marks 48 may have recesses with a certain depth and width which prevents capillary forces from pulling imprintable medium into the recesses. Alternatively or additionally, an edge (e.g. part of a profile) of features of the alignment marks 48 may form substantially a 90° angle, which may assist in the prevention of imprintable medium filling recesses provided by the alignment marks 48. In one embodiment, the alignment marks may have a depth of at least 100 nm. In an embodiment, the alignment marks 48 may have a depth of between 100 nm and 10000 nm. The widths of the recesses of these alignment marks may be, for example between 1 and 20 microns.

FIG. 3a also shows a substrate 30. The substrate 30 is provided with a layer of imprintable medium 32. The layer of imprintable medium 32 may be continuous, or may comprise a plurality of droplets. The substrate 30 is also provided with alignment marks 34 for use in aligning the imprint template 40 with the substrate 30.

Figure 3B:
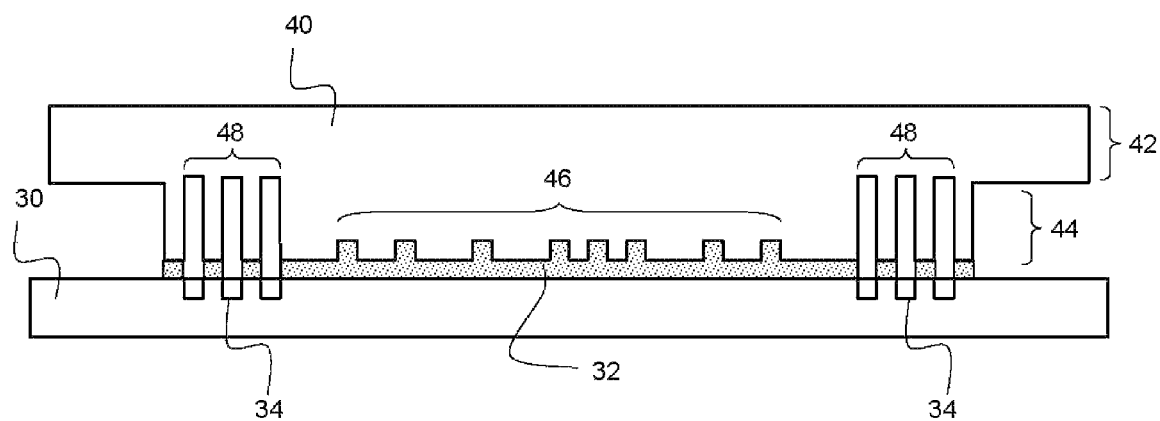

FIG. 3b shows the imprint template 40 when it has been imprinted in the imprintable medium 32. Due to the configuration of the alignment marks 48 of the imprint template 40, imprintable medium 42 does not fill the recesses provided in the alignment marks 48. This results in a gap (e.g. a gas filled gap) being formed between the alignment marks 48 of the imprint template 40 and the alignment marks 34 of the substrate 30 (or one or more parts of those alignment marks 34, 48). Since a gap is present, and no imprintable medium 32 is located between the alignment marks of the imprint template 40 and the alignment marks 34 of the substrate 30, the problem of contrast loss or reduction in signal-to-noise ratio of radiation used to align the alignment marks 48, 34 is obviated or mitigated. This embodiment thus provides a simple and elegant solution—rather than seeking to prevent imprintable medium reaching the alignment marks, the alignment marks themselves are configured to prevent filling with imprintable medium. There may thus be no need for a recess (e.g. a moat) surrounding the patterned region to prevent imprintable medium filling the alignment marks. This means that the imprint template may be less complex and costly to construct. Since there is no need to incorporate such a recess, more space may be available for applying patterns to a substrate.

FIG. 4a schematically depicts an imprint template 50 according to an embodiment of the invention. The imprint template 50 comprises of a base region 52 and a mesa region 54 extending from the base region 52. The mesa region 54 may be formed integrally with the base region 52, for example the mesa region 54 and base region 52 being formed from a single piece of material such as fused silica, or quartz or the like.

The mesa region 54 is provided with a patterned region 56 for imprinting a pattern into imprintable medium. Located on either side of the patterned region 56 are alignment marks 58 for use in aligning the imprint template 50. The patterned region 56 is located further from the base region 52 than the alignment marks 58 (i.e. the patterned region 56 and alignment marks 58 are not located in the same plane, with the alignment marks 58 being located in or on a plane which is located in-between a plane extending through the base region 52 and a plane extending through the patterned region 56). In this particular embodiment, the alignment marks 58 are provided in recesses 60 provided in the mesa regions 54 of the imprint template 50. The recesses 60 are configured such that imprintable medium is prevented from filling the recess 60 when the imprint template 50 is imprinted into the imprintable medium. The recesses 60 may form a moat around the patterned region 56. The configuration of the recesses 60 may be at least one selected from: an aspect ratio; a depth; a width; or a profile (e.g. a wall angle or the like) which results in imprintable medium being prevented from filling the recesses 60 when the imprint template 50 is imprinted into the imprintable medium.

FIG. 4a also depicts a substrate 30 provided with a layer of imprintable medium 32. The layer of imprintable medium 32 may be provided in a continuous manner, or in the form of a plurality of droplets or the like. The substrate 30 is also provided with alignment marks 34 for use in aligning the imprint template 50 with the substrate 30.

FIG. 4b schematically shows the imprint template 50 being imprinted in the imprintable medium 32 provided on the substrate 30. The patterned region 56 of the imprint template 50 is located further from the base region 52 than the alignment marks 58. When the patterned region 56 is imprinted in the imprintable medium 32, this configuration results in imprintable medium being prevented from filling recesses provided by the alignment marks 58. Since no imprintable medium fills recesses provided by the alignment marks 58 of the imprint template 50, a gap (e.g. a gas filled gap) is formed between alignment marks 58 of the imprint template 50 and alignment marks 34 of the substrate 30 (or one or more parts of those alignment marks 58, 34). The presence of the gas-filled gap improves the contrast and/or signal-to-noise ratio of radiation used to perform alignment between the alignment marks 58 of the imprint template 50 and the alignment marks 34 of the substrate 30. This embodiment thus provides a simple and elegant solution—rather than seeking to prevent imprintable medium reaching the alignment marks, the alignment marks themselves are recessed with respect to the patterned region to prevent filling of the alignment marks with imprintable medium. There may thus be no need for a recess (e.g. a moat) surrounding the patterned region to prevent imprintable medium filling the alignment marks. This means that the imprint template may be less complex and costly to construct. Since there is no need to incorporate such a recess, more space may be available for applying patterns to a substrate.

FIG. 4c schematically depicts substantially the same imprint template 50 as shown in and described with reference to FIG. 4b. However, the imprint template 50 shown in FIG. 4c is provided with a further recess 62 that is located between the alignment marks 58 and the patterned region 56. The further recess 62 is configured such that imprintable medium 32 is prevented from filling the recess 62 when the imprint template 50 is imprinted into the imprintable medium 32. This is depicted in FIG. 4c, where no imprintable medium 32 fills the further recess 62. The further recess 62 thus provides a further barrier to imprintable medium 32 approaching and filling recesses 60 provided by (or in which are located) the alignment marks 58. The recess 62 may, for example, form a moat around the patterned region 56. The recess 62 may have an aspect ratio, a depth, a width or a profile (e.g. a wall angle or the like) which results in imprintable medium being prevented from filling the recess 62 when the imprint template 50 is imprinted into the imprintable medium 32.

The recessing of the alignment marks in FIGS. 4a to 4c also allows an amount of opaque material to be provided on at least a part of the alignment marks (or used to form the alignment marks in a recess in the imprint template), without the risk of the opaque material coming in contact with the substrate during imprinting.

FIG. 4d schematically depicts the imprint template 50 of FIG. 4c, but with parts (e.g., the protrusions) of the alignment marks 58 being provided with an opaque layer of material 64. The opaque layer of material 64 does not come into contact with the substrate 30 during imprinting, because the alignment marks 58 are formed in a recess 60 (i.e. are recessed with respect to the patterned region).

Figure 5A:
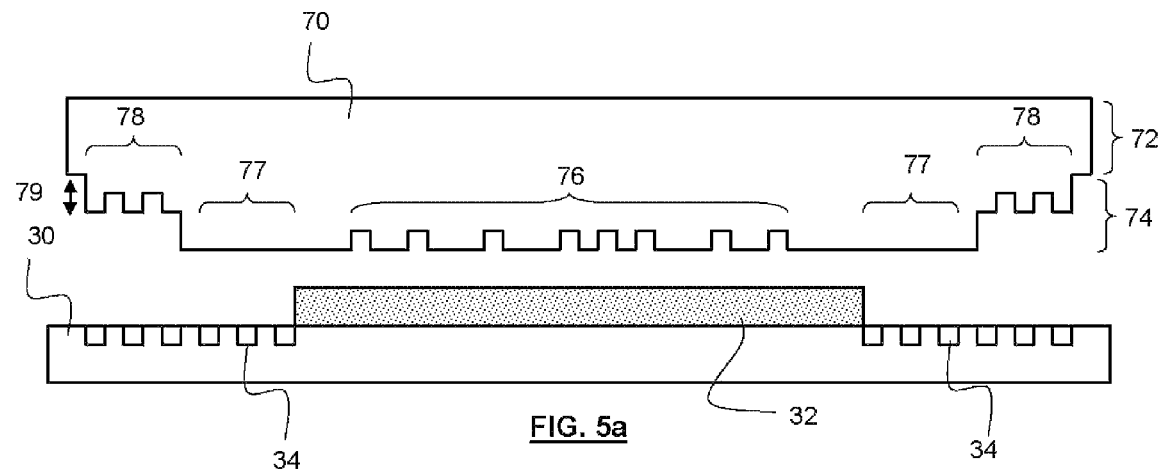
FIGS. 5a to 5c schematically depict variations of an imprint template according to an embodiment of the invention.
Figure 5B:
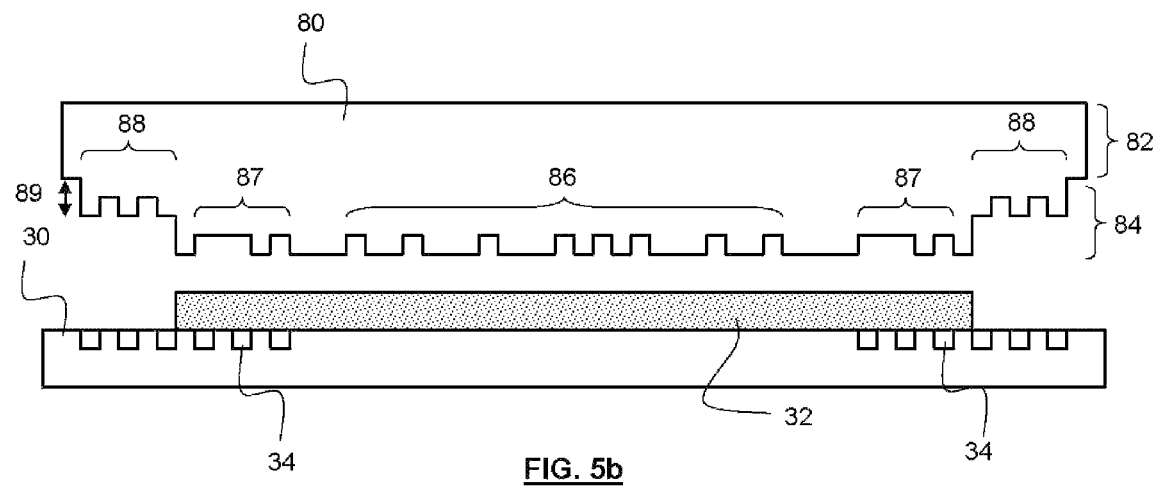
Figure 5C:
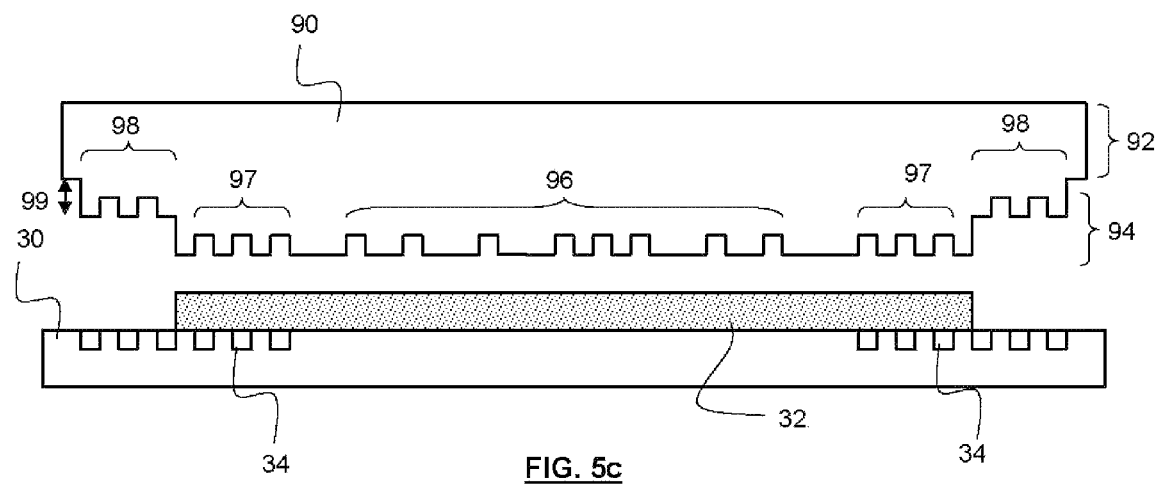

FIGS. 5a to 5c schematically depict imprint templates 70, 80 and 90 according to further, related embodiments of the invention. At first, the embodiments shown in FIGS. 5a, 5b and 5c may be referred to in combination, with specific different features of each embodiment described separately further below.

The imprint templates 70, 80 and 90 each comprise of a base region 72, 82, 92 and a mesa region 74, 84, 94 which extends from the base region, 72, 82, 92. As discussed above, the base region 72, 82, 92 may be formed integrally with the mesa region 74, 84, 94 and/or made from a single piece of material such as quartz or fused silica or the like.

The mesa region 74, 84, 94 is provided with a patterned region 76, 86, 96 for use in imprinting a pattern into imprintable medium 32 provided on a substrate 30. Located around the patterned region 76, 86, 96, and on the mesa region 74, 84, 94 are further regions 77, 87, 97, the significance of which will be described in more detail below.

Extending from the base region 72, 82, 92 are alignment marks 78, 88, 98. The patterned regions 76, 86, 96 of each imprint template 70, 80, 90 are located further from the base region 72, 82, 92 than the alignment marks 78, 88, 98 (i.e. the patterned regions 76, 86, 96 and alignment marks 78, 88, 98 are not located in the same plane, with the alignment marks 78, 88, 98 being located in or on a plane which is located in-between a plane extending through the base region 72, 82, 92 and a plane extending through the patterned region 76, 86 and 96). In these embodiments, the alignment marks 78, 88, 98 are formed on protrusions 79, 89, 99 which extend from the base region 72, 82, 92 and which are adjacent to the mesa region 74, 84, 94 of each imprint template 70, 80, 90. The protrusions 79, 89, 99 are shown as being in contact with the mesa region 74, 84, 94. In other embodiments, the protrusions 79, 89, 99 may be adjacent to but separate from the mesa region 74, 84, 94.

In a similar manner to that discussed above in relation to FIG. 4, because the patterned regions 76, 86, 96 of each imprint template 70, 80, 90 are located further from the base region 72, 82, 92 than the alignment marks 78, 88, 98, imprintable medium 32 does not fill recesses provided by the alignment marks 78, 88, 98 when the imprint template 70, 80, 90 is imprinted into imprintable medium 32. In addition, each embodiment shown in FIGS. 5a, 5b and 5c also may one or more added advantages. For instance, because the alignment marks 78, 88, 98 extend from the base 72, 82 and 92, and are not part of the mesa region 74, 84, 94 there is more space on the mesa region 74, 84 and 94 (depicted by regions 77, 87 and 97) for other uses.

Referring to FIG. 5a, the region 77 surrounding the patterned region 76 may be unpatterned. The unpatterned region 77 may nevertheless provide a further barrier to imprintable medium 32 moving towards and into the recesses provided by the alignment marks 78.

Referring to FIG. 5b, the region 87 may comprise of a further patterned region. The further patterned region may be used to imprint further patterns into the imprintable medium 32. The further patterns may be patterns used to construct devices or the like, or may be used as test structures, for example structures that may be used to test the properties of the lithography process and subsequent processing steps, such as critical dimensions or conductivity or the like. The further patterns may be patterns that will increase the speed of the imprint process.

Figure 5D:
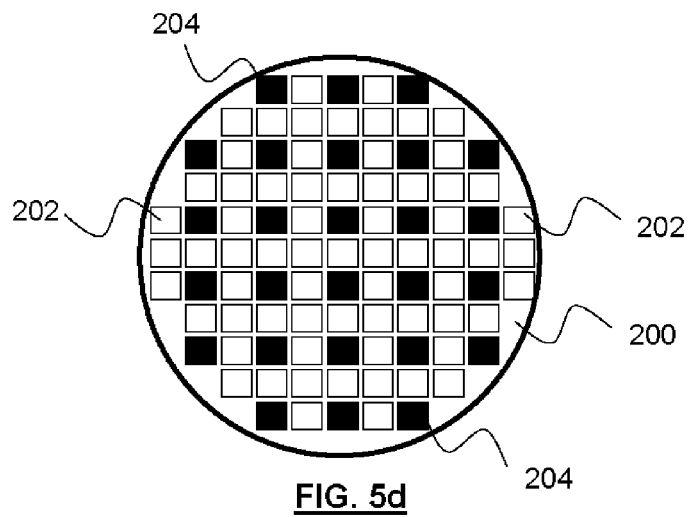
FIGS. 5d to 5f schematically depict an imprint method according to an embodiment of the invention, which may take advantage of the imprint template of FIG. 5c.
Figure 5E:
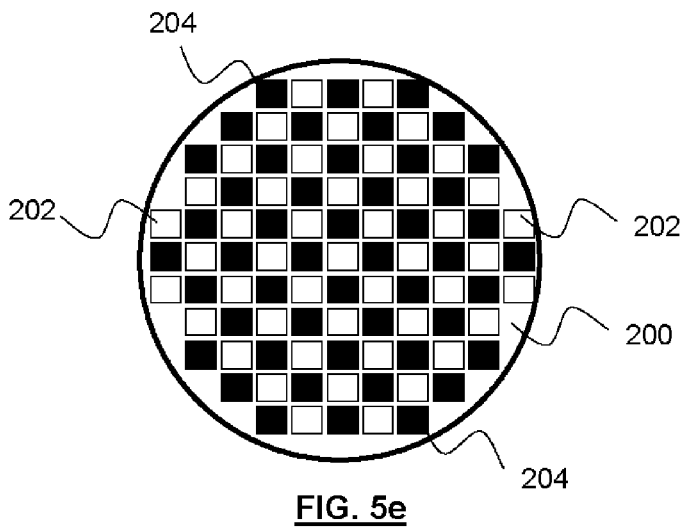

Referring to FIG. 5c, the region 97 may comprise further alignment marks 97 which are configured to be filled with imprintable medium 32 when the imprint template 90 is imprinted into the imprintable medium 32. Because the imprintable medium 32 fills the alignment marks provided in the further region 97, the alignment marks will be imprinted and provided in the imprintable medium when the pattern and alignment marks are frozen. Thus, further alignment marks are provided in the imprintable medium which may be used, for example, in a subsequent imprint process (for example, on a subsequently imprinted layer of material). Furthermore, because alignment marks are provided by the original alignment marks 98 and the further alignment marks in the region 97, a choice of alignment marks 98, 97 may be used when aligning the imprint template in adjacent or overlaying imprints. For instance, in a subsequent imprint, alignment marks that are not to be filled with imprintable medium (e.g. alignment marks 98) may be aligned with alignment marks that were provided using a previous and adjacent (i.e. neighboring) imprint in which alignment marks (e.g. alignment marks in region 97) were filled with imprintable medium and imprinted. This may be generically described as an imprint lithography method, the method comprising: undertaking a first imprint into imprintable medium provided on a first area of a substrate, and providing alignment marks in imprintable medium provided on that first area of the substrate with the first imprint; undertaking a second imprint into imprintable medium provided on a second area of a substrate that is adjacent to the first area of the substrate, the second imprint being aligned using the alignment marks provided in the first imprint. The undertaking of the second imprint may comprise providing alignment marks in imprintable medium provided on that second area of the substrate. The first area and second area may be first and second dies of the substrate. The first or second imprint may be undertaken using an imprint lithography template according to an embodiment of the invention, for example the embodiment shown in and described with reference to FIG. 5c. FIGS. 5d to 5e schematically depict an embodiment of this method in practice.

FIG. 5d schematically depicts a plan view of a substrate 200 having a plurality of dies 202 (which may be referred to as target portions, fields or areas) onto which an imprint template is to be imprinted. The substrate 200 is provided with alignment marks (not shown) for use in aligning the imprint template with the dies 202. The imprint template shown in and described with reference to FIG. 5c may be used to imprint patterns into or onto the substrate.

When an imprint is undertaken, alignment marks in or around a die 202 being imprinted may be become coated with imprintable medium. If some alignment marks are coated with imprintable medium, but others are not, alignment may be made more difficult. It is therefore desirable that alignment is undertaken using the same alignment conditions. Thus, a certain imprinting order may be undertaken.

Referring to FIG. 5d, imprints may be undertaken on dies that are not adjacent to one another, and in such a way that each imprinted die is separated by one die 202 (or more dies 202). This is depicted in FIG. 5d by shaded dies 204. During imprinting, the imprint template may be aligned with alignment marks in the substrate 200, using alignment marks outside of the mesa region of the imprint template (as described in relation to FIG. 5c). Because the imprints are separated by at least one die, the alignment conditions will be substantially the same for each die 202. The use of the imprint template in FIG. 5c also has an advantage of providing further alignment marks in the imprintable medium, for use in further imprinting steps.

Figure 5F:
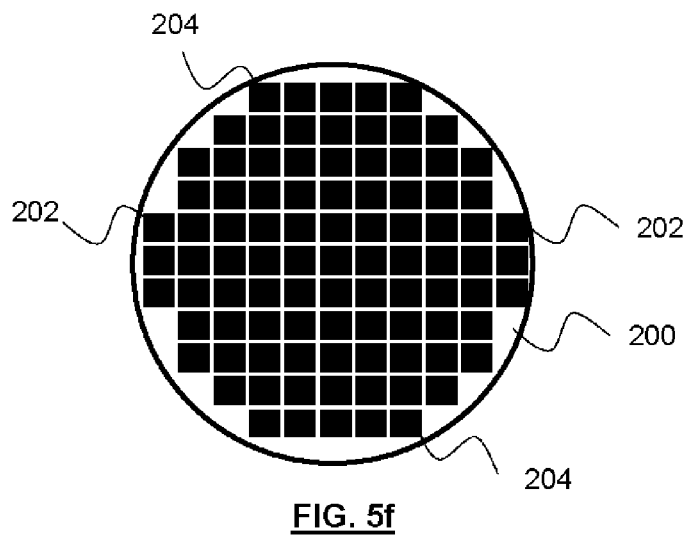

Referring to FIG. 5e, in a next step, imprints may be undertaken on different dies 202, and which are again not adjacent to one another, and in such a way that each newly imprinted die is separated by one die 202 (or more dies 202). This is depicted in FIG. 5d by shaded dies 204. During imprinting, the imprint template may be aligned with alignment marks provided in the imprintable medium in a previous and neighboring imprint (i.e. in a neighboring or adjacent die), using alignment marks outside of the mesa region of the imprint template (as described in relation to FIG. 5c). Because the imprints are separated by at least one die, the alignment conditions will again be substantially the same for each die. The use of the imprint template in FIG. 5c also has an advantage of providing further alignment marks in the imprintable medium, for use in further imprinting steps. For example, FIG. 5f shows that the imprinting process of FIG. 5e can be repeated for the remaining dies on the substrate 200. The provision of fresh alignment marks in each imprint may be useful in facilitating accurate and consistent alignment of subsequent and neighboring imprints.

The embodiments of FIGS. 5a to 5c (and their application, in FIG. 5d) provide a simple and elegant solution—rather than seeking to prevent imprintable medium reaching the alignment marks, the alignment marks themselves are recessed with respect to the patterned region to prevent filling of the alignment marks with imprintable medium. There may thus be no need for a recess (e.g. a moat) surrounding the patterned region to prevent imprintable medium filling the alignment marks. This means that the imprint template may be less complex and costly to construct. Since there is no need to incorporate such a recess, more space may be available for applying patterns to a substrate. The recessing of the alignment marks in FIGS. 5a to 5c also allows an amount of opaque material to be provided on at least a part of the alignment marks, without the risk of the opaque material coming into contact with the substrate during imprinting.

Figure 6A:
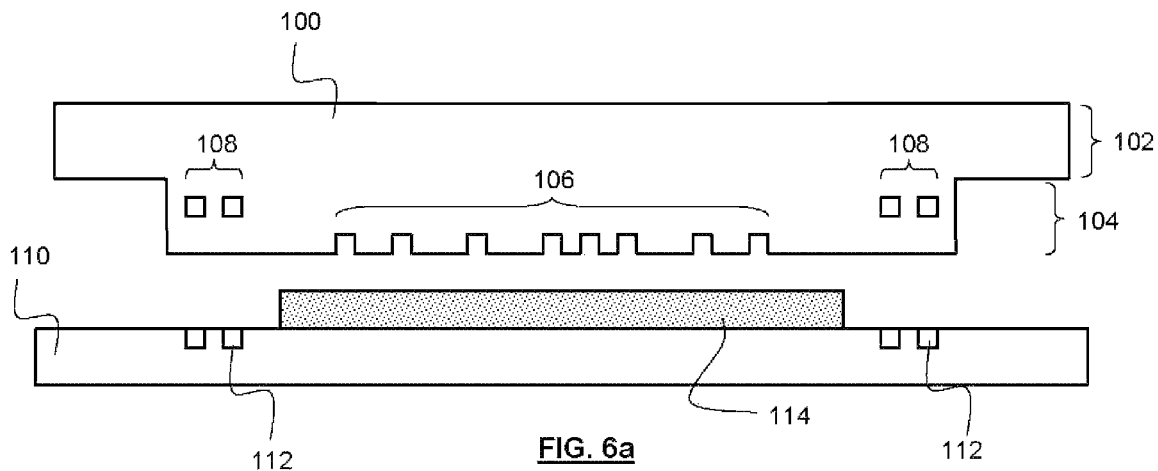
FIG. 6a schematically depicts an embodiment of a proposed imprint template.

FIG. 6a schematically depicts an imprint template 100. The imprint template 100 comprises a base region 102 and a mesa region 104 which extends from the base region 102. Provided on the mesa region 104 is a patterned region 106. Located either side of the patterned region 106 are alignment marks 108 which are embedded within the material forming the mesa region 104 of the imprint template 100. The alignment marks 108 are to be used to align the imprint template 100 with a substrate 110, which is also provided with embedded alignment marks 112. The substrate 110 is also provided with a layer of imprintable material 114. The layer of imprintable material 114 may be provided in a continuous manner or in the form of a plurality of droplets or the like.

By embedding the alignment marks 108, 112, imprintable medium 114 cannot fill the alignment marks 108, 112, and thus the problem of the loss of contrast or the poor signal-to-noise ratio of radiation used in the alignment of such marks 108, 112 may be reduced or eliminated. However, there are no structures or the like provided on a surface of the imprint template adjacent to (i.e. near to) the embedded alignment marks 108. This surface thus has no function and serves as wasted space.

Figure 6B:
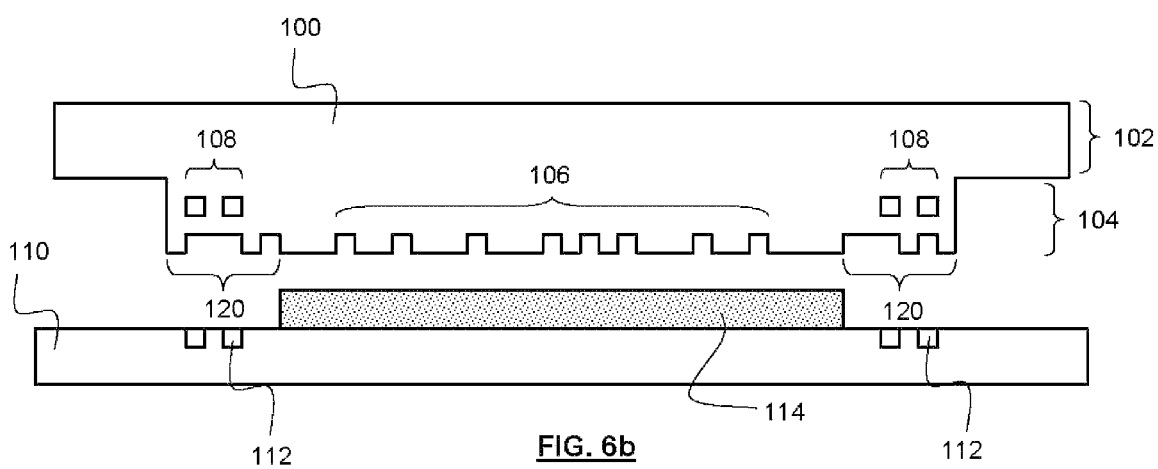
FIG. 6b schematically depicts an imprint template according to an embodiment of the invention.

FIG. 6b shows that, according to an embodiment of the invention, a surface of the imprint template 100 (e.g. a surface of the mesa region 104) adjacent to (e.g. below, when the imprint template is oriented for imprinting) the embedded alignment marks 108 is provided with a further patterned region 120. This further patterned region 120 does not comprise an alignment mark (i.e. the further patterned region 120 is free of alignment marks). The further patterned region 120 may be used to imprint further patterns into the imprintable medium 114. The further patterns may be patterns used to construct devices or the like, or may be used as test structures, for example structures that may be used to test the properties of the imprinting process, such as critical dimensions or conductivity or the like. The further patterned region 120 may be located on the imprint template to coincide with the location of scribe lines in the substrate.

It is to be understood that there is a clear distinction between alignment marks and patterned features to be used in imprinting a pattern in an imprint lithography process. For example, an alignment mark comprises one or more features having one or more dimensions of the order of micrometers. In contrast, a patterned region (e.g. the further patterned region 120) comprises one or more pattern features having one more dimensions of the order of nanometers, for example having a width of 1-100 nm and/or or a depth of 1-100 nm (e.g. 10-100 nm). Because the further patterned region 120 comprises one or more features having dimensions of nanometers, it is likely that features of this size would not interfere (or substantially interfere) with radiation used in the alignment of alignment marks 108 in the imprint template 100 and alignment marks 112 in the substrate 110, which have dimensions of the order of micrometers. Furthermore, since the imprintable medium has substantially the same refractive index as that of the imprint template (i.e. there is index matching), imprintable medium filling features of the further patterned region will result in there being no diffraction on or about features of this further patterned region.

According to any described embodiment, if the imprint template is used in an imprint method where radiation (e.g. UV radiation) is used to freeze or fix a pattern provided in imprintable medium by the imprint template, at least a part of the imprint template may be substantially transparent to that radiation.

According to an embodiment of the invention, there is provided an imprint lithography apparatus comprising: one or more imprint lithography templates according to any one or more embodiments of the invention, for use in imprinting a pattern into imprintable medium provided on a substrate; an imprint template holder configured to hold the imprint lithography template; and a substrate holder configured to hold the substrate. The imprint lithography apparatus may be used to implement an imprint process.

In any embodiment of the invention, alignment marks can be formed from recesses and/or protrusions (for example formed in or on the imprint template using the material of the imprint template, or another material) and/or by the provision of an amount of material (e.g. a layer or the like) on the imprint template. Alignments marks, and/or recesses described above, can be formed using, for example, wet or dry etching.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography template comprising:
   a patterned region to imprint a layer of imprintable medium; and
   an alignment mark for use in aligning the imprint template, the alignment mark configured such that imprintable medium is prevented from filling the alignment mark when the imprint template imprints the imprintable medium and when the alignment mark comes into contact with the imprintable medium.

2. The imprint lithography template of claim 1, wherein the configuration of the alignment mark is at least one selected from:
   an aspect ratio;
   a depth;
   a width; or
   a profile,
   which results in imprintable medium being prevented from filling the alignment mark when the imprint template imprints the imprintable medium.

3. The imprint lithography template of claim 1, wherein the alignment mark has a depth of:
   at least 100 nm; or
   between 100 nm and 10,000 nm.

4. The imprint lithography template of claim 1, further comprising a recess which is located between the alignment mark and/or a further alignment mark configured to be filled with imprintable medium when the imprint template imprints the imprintable medium, and the patterned region and/or a further patterned region free of an alignment mark adjacent an embedded alignment mark, the recess configured such that imprintable medium is prevented from filling the recess when the imprint template imprints the imprintable medium.

5. The imprint lithography template of claim 4, wherein the recess forms a moat around the patterned region and/or the further patterned region.

6. The imprint lithography template of claim 4, wherein the configuration of the recess is at least one selected from:
   an aspect ratio;
   a depth;
   a width; or
   a profile,
   which results in imprintable medium being prevented from filling the recess when the imprint template imprints the imprintable medium.

7. The imprint lithography template of claim 1, wherein the patterned region and/or a further patterned region free of an alignment mark adjacent an embedded alignment mark, comprises one or more features having one or more dimensions of the order of nanometers.

8. The imprint lithography template of claim 7, wherein the patterned region and/or further patterned region comprises one or more features having a depth of 10-100 nm.

9. The imprint lithography template of claim 1, wherein the alignment mark and/or a further alignment mark configured to be filled with imprintable medium when the imprint template imprints the imprintable medium, comprises one or more features having one or more dimensions of the order of micrometers.

10. The imprint lithography template of claim 1, wherein the alignment mark and/or a further alignment mark configured to be filled with imprintable medium when the imprint template imprints the imprintable medium, is provided with an amount of material that is substantially opaque to radiation that is to be used to align the imprint template.

11. An imprint lithography template comprising:
    a base region;
    a mesa region that extends from the base region, the mesa region having a patterned region to imprint a layer of imprintable medium; and
    an alignment mark for use in aligning the imprint template, at least a portion of the mesa region being on one side of the alignment mark and a structure extending from the base region being on an opposite side of the alignment mark,
    wherein a furthest part of the patterned region from the base region is located further from the base region than a furthest part of the alignment mark from the base region and a furthest part of the structure from the base region is located further from the base region than a furthest part of the alignment mark from the base region.

12. The imprint lithography template of claim 11, wherein the alignment mark is in a recess provided in the mesa region.

13. The imprint lithography template of claim 11, wherein the alignment mark is on a protrusion which extends from the base region and which is adjacent to the mesa region.

14. The imprint lithography template of claim 11, wherein the mesa region further comprises a further alignment mark configured to be filled with imprintable medium when the imprint template imprints the imprintable medium.

15. An imprint lithography template comprising:
    a patterned region to imprint a layer of imprintable medium;
    an alignment mark for use in aligning the imprint template, the alignment mark embedded within material forming the imprint template and not having topographical features on an external surface of the imprint template facing toward the imprintable medium; and a surface of the imprint template adjacent the embedded alignment mark having a further patterned region, the further patterned region being free of an alignment mark.

16. The imprint lithography template of claim 15, wherein the further patterned region comprises one or more structures configured, in use, to form test structures in the imprintable medium.

17. An imprint lithography apparatus comprising:
 an imprint lithography template configured to imprint a pattern into an imprintable medium on a substrate, the imprint lithography template comprising a patterned region to imprint a layer of imprintable medium, and an alignment mark for use in aligning the imprint template, the alignment mark configured such that imprintable medium is prevented from filling the alignment mark when the imprint template imprints the imprintable medium and when the alignment mark comes into contact with the imprintable medium;
 an imprint template holder configured to hold the imprint lithography template; and
 a substrate holder configured to hold the substrate.

18. The imprint lithography apparatus of claim 17, wherein the configuration of the alignment mark is at least one selected from:
 an aspect ratio;
 a depth;
 a width; or
 a profile,
 which results in imprintable medium being prevented from filling the alignment mark when the imprint template imprints the imprintable medium.

19. The imprint lithography apparatus of claim 17, comprising a further alignment mark configured to be filled with imprintable medium when the imprint template imprints the imprintable medium and to provide an alignment mark in the imprintable medium.

20. The imprint lithography apparatus of claim 17, wherein the alignment mark has a depth of:
 at least 100 nm; or
 between 100 nm and 10,000 nm.

21. The imprint lithography apparatus of claim 17, further comprising a recess which is located between the alignment mark and/or a further alignment mark configured to be filled with imprintable medium when the imprint template imprints the imprintable medium, and the patterned region and/or a further patterned region free of an alignment mark adjacent an embedded alignment mark, the recess configured such that imprintable medium is prevented from filling the recess when the imprint template imprints the imprintable medium.

* * * * *